United States Patent [19]
Mooney et al.

[11] 3,991,446
[45] Nov. 16, 1976

[54] ONE PIECE KNOCK-OUT PLUG

[75] Inventors: Thomas Mooney, Mount Sinai; Stephen Veselaski, Shirley, both of N.Y.

[73] Assignee: I-T-E Imperial Corporation, East Farmingdale, N.Y.

[22] Filed: Apr. 30, 1975

[21] Appl. No.: 573,015

[52] U.S. Cl. .................................... 24/73 P; 16/2; 174/153 G
[51] Int. Cl.² ................... F16C 1/10; H01B 17/26; B65D 11/26
[58] Field of Search ............... 24/73 P, 73 PF, 73 S, 24/73 AP, 73 PM; 16/2; 85/5 R; 174/152 G, 153 G

[56] References Cited
UNITED STATES PATENTS

| | | | |
|---|---|---|---|
| 2,424,757 | 7/1947 | Klumpp | 174/153 G |
| 3,373,463 | 3/1968 | Wells | 24/73 PM |
| 3,397,280 | 8/1968 | Klumpp | 16/2 X |
| 3,506,999 | 4/1970 | Neher | 16/2 |
| 3,631,738 | 1/1972 | Harper | 85/5 R X |
| 3,869,958 | 3/1975 | Murayama | 24/73 P X |

FOREIGN PATENTS OR APPLICATIONS

| | | | |
|---|---|---|---|
| 1,111,742 | 11/1955 | France | 16/2 |
| 942,129 | 11/1963 | United Kingdom | 16/2 |

*Primary Examiner*—Donald A. Griffin
*Attorney, Agent, or Firm*—Howard C. Miskin

[57] ABSTRACT

A closure or bushing member for openings in electrical boxes, conduit ends and the like is formed as an integral unit of a thermoplastic synthetic organic polymeric resin and includes a disc or annular shaped head and a coaxial hollow cylindrical shank of lesser diameter. Extending from opposite sides of the distal end of the shank are a pair of opposite radially projecting arms, which terminate in wing members of greater width than the radial arms and which have conically surfaced outer faces flaring rearwardly outwardly. A peripheral recess is formed in the rear outer face of each wing to provide a rearwardly facing shoulder for resiliently engaging the inside border of the opening to which the closure member is applied to retain the closure member therein.

7 Claims, 4 Drawing Figures

ONE PIECE KNOCK-OUT PLUG

BACKGROUND OF THE INVENTION

The present invention relates generally to improvements in access opening plug devices and it relates more particularly to an improved closure device or bushing device for use in the walls of electrical fittings such as junction boxes, switch boxes and the walls of similar enclosures and the like.

In many electrical wall and enclosure structures, such as switch and junction boxes which receive electrical conduit and the like, it is frequently highly desirable or necessary to plug an opening in the enclosure wall either to close the openings or provide it with a bushing to facilitate the non-abrasive passage of an electrical cable. The cables are often snakes through the conduit and bent in the junction box. These openings are generally circular and are produced with large tolerances, so that there is a great variation in the diameter of the opening from the nominal diameter. Accordingly, any plug device to be satisfactory, whether it be a closure device or a bushing device, must accommodate to a wide range of sizes while permitting easy application of the plug device and its firm engagement of the receiving opening. There have been many forms of opening plug devices available and proposed but these possess numerous drawbacks and disadvantages. They are often unreliable and difficult to apply, accommodate limited variations in diameter of the hole, are expensive and are of little versatility and adaptability.

SUMMARY OF THE INVENTION

It is accordingly a principal object of the present invention to provide an improved opening plugging device.

Another object of the present invention is to provide an improved closure or bushing device for openings in electrical enclosures such as junction boxes, switch boxes, and other fixture boxes, electrical conduit and the like.

Still another object of the present invention is to provide an improved closure or bushing device for an opening in an electrical enclosure in which the opening may widely vary from its nominal dimensions and the device may be easily and rapidly applied and effects a secure and firm engagement with the opening.

A further object of the present invention is to provide an improved device of the above nature, characterized by its high reliability, ruggedness, simplicity, low cost and great versatility and adaptability.

The above and other objects of the present invention will become apparent from a reading of the following description taken in conjunction with the accompanying drawings which illustrate a preferred embodiment thereof.

In a sense the present invention contemplates the providing of an opening plug device in the form of a closure or bushing, the plug device being formed of a synthetic organic polymeric, preferably thermoplastic resin and comprising a longitudinally extending core section, a transversely outwardly enlarged head section located at the rear of the core section, a plurality of peripherally spaced outwardly projecting connector arms extending from the front of the core section and a locking section located at the free end of and of greater width than each of the arms and having an outwardly rearwardly outside face. The locking sections are highly transversely resilient by reason of the relatively thin connector arms.

In the preferred form of the improved device the core section is cylindrical and tubular and the head section is circular and flat and coaxial with the core section and in the case of the closure device is a disc and in the case of the bushing device is an annulus. A pair of connector arms are provided and are diametrically aligned and radially projecting. Each of the connector sections extends rearwardly from a respective arm to a point short of the head section and extends peripherally in opposite directions from the arm. The outside face of each locking section is conical except for the forward border thereof which is cylindrical and a peripheral recess is formed in the locking section rear outside face and delineates outwardly facing and rearwardly facing shoulders.

The improved plug device is simple, rugged and reliable, is easy to apply, is suitable for openings having a wide range of dimensional differences and is of great versatility and adaptability.

DESCRIPTION OF THE PREFERRED EMBODIMENT

Figure 1:
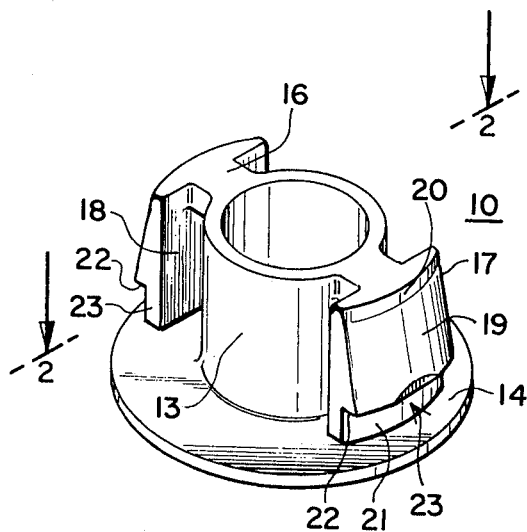
FIG. 1 is a bottom perspective view of a closure device embodying the present invention.
Figure 2:
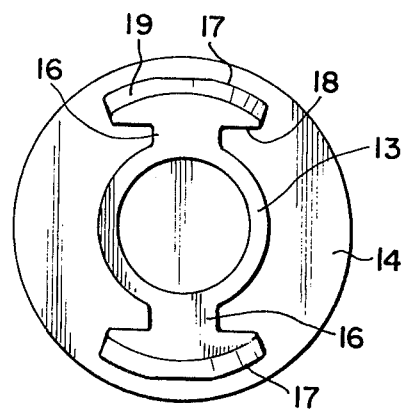
FIG. 2 is a bottom plan view thereof.
Figure 3:
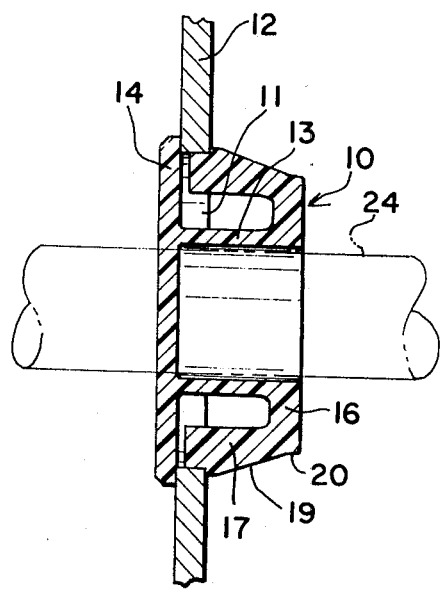
FIG. 3 is a medial longitudinal cross sectional view thereof illustrated applied to electrical box wall opening.

Referring now to the drawings and more particularly FIGS. 1–3 thereof, which illustrate a preferred embodiment of the present invention, the reference numeral 10 generally designates the improved plug device in the form of a closure, which is shown applied to a circular opening 11 in a wall 12 of an electrical enclosure such as a switch box, junction box and the like. The plug device 10 is integrally formed by any conventional method, such as injection molding, of a resilient synthetic organic polymeric resin, for example, a polyolefin such as polyethylene or polypropylene, nylon, polystyrene and the like.

The plug device 10 includes a longitudinally extending cylindrical core or tubular section 13 having formed at its rear end an enlarged flat circular head section 14 coaxial with the core section 13. When the plug device 10 is employed as a closure device, the circular head section 14 is in the form of a flat disc; when it is employed as a bushing, the head section is in the form of an annulus with a central opening of a diameter equal to the inside diameter of the core section 13.

Projecting radially outwardly from diametrically opposite portions of the circumference at the forward end of the core section 13 are a pair of radially extending relatively narrow resilient arms 16. Each of the arms 16 terminates at its free end in a respective locking wing or section 17; the front faces of core section 13, arms 16 and locking sections 17 being coplanar.

Each of the locking sections 17 is symmetrical to the medial radial axis of the corresponding arm 16 and has a segment shaped transverse cross section. The locking sections 17 extend transversely from opposite sides of respective arms 16 and extend rearwardly from the arms 16 to points just short of the head 14 and proximate the outer border thereof. The inside faces 18 of the locking sections 17 are transverse and planar and the main part of the outside faces thereof 19, are conical and coaxial with the core section 13, flaring outwardly rearwardly. The front narrow border 20 of the locking section outside face 19 is cylindrical and coaxial with the core section 13. Formed in the rear border of the outside face 19 of each locking section 17 is a right angle peripherally extending recess 21, which delineates a peripherally extending rearwardly facing flat shoulder 22 and a peripherally extending outwardly facing cylindrical shoulder 23.

Considering now the operation of the improved plug device 10 in the closing of the opening 11 in wall 12, in applying the plug device 10, the front end thereof, as guided by the forward cylindrical border faces 20, is inserted into the opening 11 and pressure is applied to the head section 14 to advance the plug device 10 through the opening 11. With the forward advance of the plug device 10, the peripheral edge of the opening 11 bears on the conical portion of faces 19 to swing in the locking sections 17, which are resiliently biased outwardly by the arms 16. When the plug device 10 reaches its fully advanced inserted position, the front face of head section 14 bears on the outside face of the wall 12 bordering the opening 11, as shown in FIG. 3, and the locking sections 17 are resiliently snapped outwardly by the arms 16 to bring each surface of shoulder 23 into tight engagement with the peripheral face of the opening 11 and the shoulder 22 into engagement with the inside face of wall 12 bordering the opening 11. Thus, the wall 12 bordering the opening 11 is tightly embraced between the shoulder 22 and the head section 14 and the plug device 10 is firmly locked in position.

The same procedure is employed where the device 10 is a bushing device instead of a closure device where the head section 14 is an annulus permitting the passage of a cable 24 therethrough.

Figure 4:
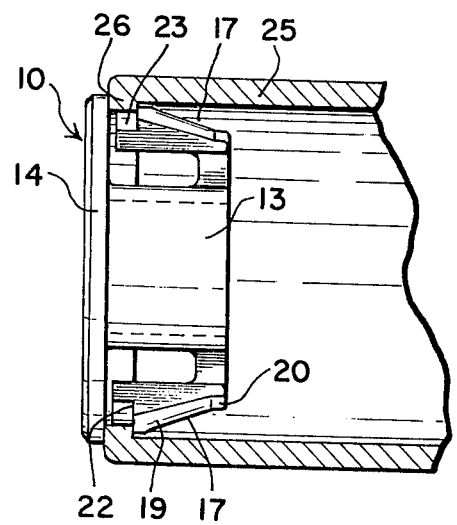
FIG. 4 is a side elevational view thereof illustrated applied to the inwardly flanged open end of an electrical conduit.

In FIG. 4 of the drawing, there is illustrated the application of the closure device 10, described above, to the closing of the end of a pipe or conduit 25, for example, an electrical conduit, which is provided at its open end with an inwardly directed peripheral lip or flange 26. The plug device 10 is applied by inserting it into the opening delineated by the peripheral lip 26 and operates in the manner explained above. Moreover, the device 10 may be in the form of a bushing with the head section 14 being of annular shape with an opening 28 therein, coaxial to core section 13, as previously described.

While there has been described and illustrated a preferred embodiment of the present invention, it is apparent that numerous alterations, omissions and additions may be made without departing from the spirit thereof.

What is claimed is:

1. A plug device integrally formed of a synthetic organic polymeric resin and comprising a longitudinally extending core section, a transversely outwardly enlarged head section located at the rear of said core section, a plurality of peripherally spaced outwardly projecting arms extending from the front of said core section, and a locking section located at the free end of and of peripherally greater width than each of said arms and having an outwardly rearwardly outwardly flaring conical outside face coaxial with said core, the rear outer edge of each of said locking sections being recessed along the periphery thereof to provide a rearwardly facing outer peripheral shoulder and an outwardly facing peripheral shoulder extending to the rear end of the respective locking section.

2. The plug device of claim 1 wherein said core section is of cylindrical configuration and said head section is circular and coaxial with said core section.

3. The plug device of claim 2 wherein said core section is tubular and said head section comprises a substantially flat disc.

4. The plug device of claim 2 wherein said core section is tubular and said head section has an opening therethrough coaxial with said core section.

5. The plug device of claim 1 wherein the inside face of each of said locking sections is substantially flat and extends longitudinally.

6. The plug device of claim 1 wherein there are provided two of said arms which are diametrically aligned and extend radially from opposite sides of said core section.

7. The plug device of claim 1 wherein the forward border of each of said locking section outside faces is cylindrical.

* * * * *